United States Patent [19]

Hayakawa et al.

[11] Patent Number: 4,824,518
[45] Date of Patent: Apr. 25, 1989

[54] METHOD FOR THE PRODUCTION OF SEMICONDUCTOR DEVICES

[75] Inventors: Toshiro Hayakawa; Takahiro Suyama; Kohsei Takahashi; Saburo Yamamoto, all of Nara, Japan

[73] Assignee: Sharp Kabushiki Kaisha, Osaka, Japan

[21] Appl. No.: 843,146

[22] Filed: Mar. 24, 1986

[30] Foreign Application Priority Data

Mar. 29, 1985 [JP] Japan .................................. 60-67447
Apr. 8, 1985 [JP] Japan .................................. 60-74976

[51] Int. Cl.$^4$ ............................................ H01L 21/20
[52] U.S. Cl. .................................... 156/613; 156/601;
156/DIG. 70; 148/175; 148/DIG. 169;
148/DIG. 17; 148/DIG. 25; 29/576 E;
437/225
[58] Field of Search ............... 156/DIG. 70, 613, 601;
148/175, DIG. 169, 17, 25; 29/576 E

[56] References Cited

U.S. PATENT DOCUMENTS 4,314,873  2/1982  Wieder et al. .............. 156/DIG. 70
4,330,360  5/1982  Kubiak et al. .............. 156/DIG. 70
4,464,342  8/1984  Tsang ......................... 156/DIG. 70
4,493,142  1/1985  Hwang ............................... 148/175

FOREIGN PATENT DOCUMENTS 0031180   7/1981  European Pat. Off. .
61-24710   7/1984  Japan ....................... 148/DIG. 169
60-15917   1/1985  Japan ....................... 148/DIG. 169
0086819    5/1985  Japan ....................... 148/DIG. 169
0261128   12/1985  Japan ....................... 148/DIG. 169
2095704   10/1982  United Kingdom ..... 148/DIG. 169

OTHER PUBLICATIONS

Parker, "The Technology and Physics of Molecular Beam Epitaxy", (Plenum, 1985) pp. 43–44.
Tsang (1981) Applied Physics Letters 38: 587–589.
Miller et al., (1985) Journal of Applied Physics 57: 1922–1927.
H. Asahi et al., J. Appl. Phys. 53(7):4928–4931 (1982).
Search Report on Corresponding U.K. Patent Application No. 8607458, inventors Hayakawa, et al.
Takamori et al., (1904) Japanese Journal of Applied Physics. 23: L599–L601.
Kawamura et al., (1981) Japanese Journal of Applied Physics. 20: L807–L810.

Primary Examiner—Asok Pal
Attorney, Agent, or Firm—Irell & Manella

[57] ABSTRACT

A method for the production of semiconductor devices comprising: subjecting a GaAs substrate with an oxidized film thereon to a degasification treatment, heating the substrate during a radiation treatment by a molecular beam within a pre-treatment chamber to remove the oxidized film from the substrate, and growing a phosphorous compound semiconductor layer on the substrate by molecular beam epitaxy within a growth chamber connected to the pre-treatment chamber.

3 Claims, 1 Drawing Sheet

METHOD FOR THE PRODUCTION OF SEMICONDUCTOR DEVICES

BACKGROUND OF THE INVENTION

1. Field of the invention

This invention relates to a method for the production of semiconductor devices and an apparatus for the same. More particularly, it relates to a method for the production of semiconductor devices using molecular beam epitaxy which allows the growth of a phosphorous compound semiconductor with a light emission wavelength of less than 700 nm on a GaAs substrate, resulting in light emitting semiconductor devices with high accuracy, and an apparatus for the same.

2. Description of the prior art

In recent years, optical communication techniques based on optical devices such as semiconductor lasers and light-emitting diodes and optical information processing techniques based on optical discs have been developed. Optical devices having a wavelength at which a laser light is emitted therefrom in the visible region are required, and expectations of visible semiconductor lasers are particularly high. GaAlAs semiconductor lasers with an oscillation wavelength of 780 nm have been put into use as a light source for compact discs and video discs. However, in order to handle a greater amount of information, it is necessary for the diameter of the focused spot to be decreased, and for this purpose, semiconductor lasers with a shorter oscillation wavelength are required.

As a semiconductor material which has an energy gap corresponding to this shorter wavelength region, $(Al_xGa_{1-x})_yIn_{1-y}P$ with a lattice matched to a GaAs substrate is attracting attention. Crystals of this material are grown only with difficulty by the conventional method of liquid-phase epitaxy (LPE), and in recent years, research and development into crystal growth using molecular beam epitaxy (MBE) and metal organic-chemical vapor deposition (MO-CVD) has been active.

By MBE, in particular, it is possible to obtain a heterojunction interface with a steep energy gap. Thus, MBE offers extremely good prospects for the development of quantum well (QW) lasers as well as double-heterostructured semiconductor lasers.

However, when a phosphorous compound semiconductor is grown on a GaAs substrate using a conventional molecular beam epitaxial apparatus (MBE apparatus), the substrate is heated during a radiation treatment by an As molecular beam in a growth chamber in order to remove a film which has been formed as a protective film on the substrate by the oxidation of GaAs in the air (H. Asahi, Y. Kawamura, and H. Nagai, J. Appl. Phys., vol. 53 (1982), p. 4928). This method is usually used for the growth of semiconductor crystals containing As such as AlGaAs on the GaAs substrate. However, this method is undesirable for the growth of semiconductor crystals containing phosphorous because As which is detrimental for crystal growth is unavoidably brought into the growth chamber. If the amount of As incorporated into the phosphorous compound semiconductor is even only 1%, the lattice constant will be greatly changed, and high quality semiconductor crystals cannot be obtained. During the process of removal of the oxidized film of GaAs, it is impossible to lower the strength of the As molecular beam which has an extremely high pressure of $10^{-4}$–$10^{-5}$ torr in a short time. Thus, it takes a long time for the removal of the oxidized film. Moreover, the As used in the growth chamber is present during the growth of the phosphorous compound semiconductor crystals, so that substantial contamination by As is unavoidable.

It might be possible to remove the oxidized film from the GaAs substrate by heating the substrate with radiation from a P molecular beam instead of the As molecular beam, but compared to As, the vapor pressure of P is so high that the removal of the oxidized film from the GaAs substrate is hardly affected at the ordinary evaporation temperature of about 580° C. under a P pressure of $10^{-5}$ torr or less. Moreover, if a strong P molecular beam is used, As vaporizes and the surface of the GaAs substrate may change to GaAsP, which is undesirable.

FIG. 2 shows a conventional MBE apparatus which comprises a chamber 1 for loading a substrate therein, a chamber 2 for heating the substrate, and a chamber 4 for growing epitaxial crystal layers on the substrate. The chambers 1, 2 and 4 are separated by gate valves 5, 7 and 8, respectively. The substrate to be used for crystal growth is introduced into the chamber 1 and then moved to the chamber 2 which is in vacuum. In this chamber 2, the substrate is heated to a suitable temperature to eliminate adsorbed impurities and/or gases from the surface of the substrate. After degasification, the substrate is moved to the growth chamber 4, where the substrate is heated during a radiation treatment by an As molecular beam in order to remove the oxidation film and epitaxial crystal layers are grown on the substrate.

According to MBE, raw materials for crystal growth are vaporized and emitted into the growth chamber 4, which has a good vacuum, from a nozzle in the form of a molecular stream, resulting in epitaxial layers on the substrate. In the growth chamber 4, a suitable number of tubes which form the molecular stream, called Kundsen cells, are provided. Part of each of these cells has pores from which the molecular stream of vaporized materials is emitted. This emission rate is controlled between the cells such that the growth of a thin film composed of two or more components can be formed. In order to attain epitaxial growth with accuracy, it is necessary to maintain the inside of the growth chamber 4 at a high vacuum level, and to control the emission rate of the materials for growth thereby achieving a slow growth rate (e.g., several nanometers per minute). It is also necessary to choose an adhesion efficiency of each of the components for the substrate in light of characteristics of the said components.

When a phosphorous compound semiconductor is grown on a substrate such as GaAs, etc., using MBE, the above-mentioned difficulties arise, and it is difficult to obtain crystal layers of good quality.

SUMMARY OF THE INVENTION

The method for the production of semiconductor devices of this invention which overcomes the above-discussed and numerous other disadvantages and deficiencies of the prior art, comprises subjecting a GaAs substrate with an oxidized film thereon to a degasification treatment, heating the substrate during a radiation treatment by a molecular beam within a pre-treatment chamber to remove the oxidized film from the substrate, and growing a phosphorous compound semiconductor layer on the substrate by molecular beam epitaxy within a growth chamber connected to the pre-treatment chamber.

The molecular beam is, in a preferred embodiment, of As. Alternatively, the molecular beam is, in a preferred embodiment, of In.

The molecular beam epitaxial apparatus of this invention which overcomes the above-discussed and numerous other disadvantages and deficiencies of the prior art, comprises a heating chamber for degassing a GaAs substrate, a pre-treatment chamber having a heating means for heating said substrate and molecular beam-generating cells for treating the surface of said substrate, said pre-treatment chamber being connected to said heating chamber, and a molecular beam epitaxial growth chamber for growing a phosphorous compound semiconductor on said substrate, said growth chamber being connected to said pre-treatment chamber.

The heating chamber, the pre-treatment chamber and the growth chamber are, in a preferred embodiment, connected in series through gate valves. Alternatively, these chambers are, in a preferred embodiment, connected in parallel to a transportation chamber through gate valves.

The molecular beam-generating cells are, in a preferred embodiment, As cells. Alternatively, the molecular beam-generating cells are, in a preferred embodiment, In cells.

Thus, the invention described herein makes possible the objects of (1) providing a method for the production of semiconductor devices, by which a GaAs substrate with a high quality surface for crystal growth is obtained, and a high quality phosphorous compound semiconductor is grown on the surface of the GaAs substrate without contamination by As by molecular beam epitaxy, resulting in a semiconductor device emitting light with a wavelength of 700 nm or less; (2) providing a method for the production of semiconductor devices, by which semiconductor crystals such as InGaP or InGaAlP with a light emission wavelength of 700 nm or less are grown on a GaAs substrate without deterioration of the surface of the substrate by molecular beam epitaxy, resulting in a light emitting InGaAlP semiconductor device or an InGaAlP semiconductor laser which can oscillate with a shorter wavelength than that of He-Ne gas lasers; (3) providing a molecular beam epitaxial apparatus in which a GaAs substrate with a high quality surface for crystal growth is obtained, and a high quality phosphorous compound semiconductor is grown on the surface of the GaAs substrate without contamination by As; and (4) providing a molecular beam epitaxial apparatus which is designed in a manner to prevent As from being brought into a growth chamber where phosphorous compound semiconductor crystals are grown on a GaAs substrate so that P is not contaminated by As during the growth process, so that the apparatus can produce uniform phosphorous compound semiconductors for a long period of time.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
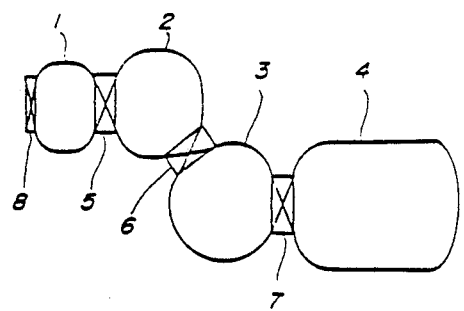
FIG. 1 is a schematic diagram showing a molecular beam epitaxial apparatus of this invention.
Figure 2:
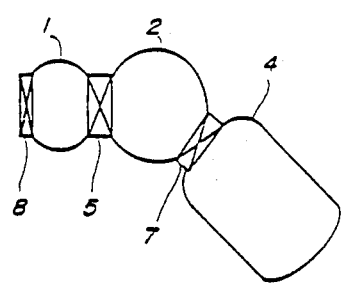
FIG 2 is a schematic diagram showing a conventional molecular beam epitaxial apparatus.

FIG. 1 shows a molecular beam epitaxial apparatus (MBE apparatus) of this invention, which comprises a chamber 1 for loading a GaAs substrate, a chamber 2 for heating the substrate, a chamber 3 for pre-treating the substrate, and a chamber 4 for growing semiconductor crystals on the substrate, in that order. This MBE apparatus is different from the conventional MBE apparatus shown in FIG. 2 in that it has the pre-treatment chamber 3 between the heating chamber 2 and the growth chamber 4. The GaAs substrate can be carried from the chamber 1 to the chamber 4 through the chambers 2 and 3 by means of a conveying means under an extremely high vacuum. The chambers 1, 2, 3 and 4 are usually separated by gate valves 5, 6 and 7. The pre-treatment chamber 3 is provided with a heating means for heating the substrate and As cells for treating the surface of the substrate.

Using this apparatus, molecular beam epitaxial layers are grown on the substrate as follows:

As the substrate on which phosphorous compound semiconductor crystals are grown, a GaAs substrate is used. The GaAs substrate is subjected to an etching treatment with an etchant containing sulfuric acid, followed by forming an oxidized film on the surface of the GaAs substrate in a pure water. The GaAs substrate is then fixed to a molybdenum block by an indium solder, and loaded into the chamber 1 through the valve 8. After the valve 8 is closed, the chamber 1 is in vacuum ranging from $10^{-8}$ to $10^{-9}$ torr. The valve 5 of the chamber 2 is then opened, and the GaAs substrate is carried from the chamber 1 to the chamber 2. The valve 5 is then closed. In the chamber 2, the GaAs substrate is gradually heated to 400° C. The liberation of gas reduces the vacuum level in the chamber 2 at the early phase of the heating process, but an extremely high vacuum of $10^{-10}$ torr can be created after 30–60 minutes. Under the extremely high vacuum, adsorbed impurities and/or gas of the GaAs substrate are removed. The GaAs substrate, the degasification of which has been completed, is then carried from the heating chamber 2 to the pre-treatment chamber 3 through the gate valve 6, in which the GaAs substrate is gradually heated to about 600° C. during a radiation treatment by an $As_4$ molecular beam with about $10^{-6}$ –$10^{-5}$ torr, and is allowed to stand at about 600° C. for about 10 minutes, after which the temperature of the GaAs substrate is lowered to 200° C. or less during a radiation treatment by the $As_4$ molecular beam, thereby achieving complete removal of the oxidized film formed on the GaAs substrate and obtaining a GaAs substrate with a clean surface. When a liquid nitrogen shroud is installed in the pre-treatment chamber 3, the As having a relatively high vapor pressure can be effectively removed. Even though the As deposits on the clean surface of the GaAs substrate, the deposited As is completely evaporated by a heating process prior to the subsequent epitaxial growth process. However, since the As deposited on the GaAs substrate functions as a protective film which prevents residual gas from adhering to the surface of the GaAs substrate while the GaAs substrate is carried from the pre-treatment chamber 3 to the growth chamber 4, it is desirable that radiation with the As molecular beam is continued, even after the temperature of the GaAs substrate is lowered, so as to positively deposit the As on the GaAs substrate.

The GaAs substrate is then carried from the pre-treatment chamber 3 to the growth chamber 4 through the gate valve 7, in which the GaAs substrate is heated to a growth temperature of, for example, 500° C. during a radiation treatment by a P molecular beam, and then radiated with molecular beams of Group III of the periodic table, In Al and Ga in this example, to start the epitaxial growth of $(Al_xGa_{1-x})_yIn_{1-y}P$ layers thereon. In order to grow high-quality crystals on the substrate, the growth temperature is controlled as follows: The growth is started at a relatively low temperature in order to prevent as much deterioration of the GaAs substrate as possible resulting from the removal of As therefrom. After the growth begins, the temperature of the GaAs substrate is gradually raised to the optimum level (e.g., 600° C.), resulting in high-quality GaAlInP epitaxial growth layers on the GaAs substrate.

On the top of the GaAlInP layers, a p-n junction for photoelectric conversion is formed and electrodes are disposed thereon, resulting in a light emitting semiconductor device which emits a light with a short wavelength. Alternatively, the parameters x and y in the $(Al_xGa_{1-x})_yIn_{1-y}P$ layers are selected to be suitable values, resulting in a double-heterostructured semiconductor laser device with a multiple-layered crystal structure which has an active layer for laser oscillation and cladding layers facing the said active layer with the heterojunction interface therebetween.

EXMAPLE 2

Figure 3:
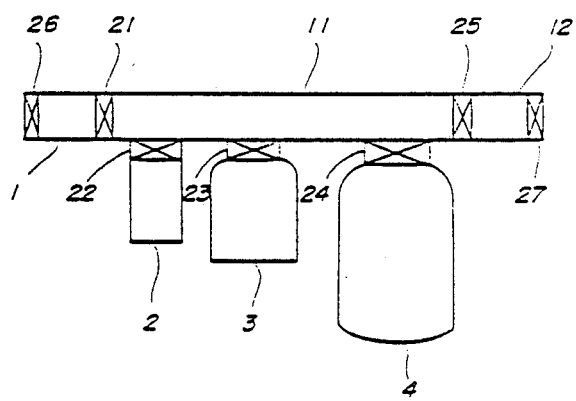
FIG. 3 is a schematic diagram showing another molecular beam epitaxial apparatus.

FIG. 3 shows another MBE apparatus of this invention, which comprises a chamber 11 for the transportation of a GaAs substrate, a chamber 1 for loading the substrate which is connected to one end of the chamber 11 through a gate valve 21, a chamber 12 for unloading the substrate which is connected to the other end of the chamber 11 through a gate valve 25, and chambers 2, 3 and 4 which are positioned between the chambers 1 and 12 and connected in parallel to the chamber 11 through gate valves 22, 23 and 24, respectively. The chambers 2, 3 and 4 are the same as those in Example 1. The transportation of the GaAs substrate from the vacuum chamber 2 to the vacuum chamber 3 and from the vacuum chamber 3 to the vacuum chamber 4 is carried out through the chamber 11. With the apparatus of the above-mentioned structure, the substrate introduced into the chamber 1 through the gate valve 26 is removed from the chamber 12 through the gate valve 27 after the crystal growth is completed thereon. That is, the transportation of the substrate is carried out in a one-way line from the chamber 1 to the chamber 12 so that the crystal growth can be continuously achieved on a plurality of substrates.

Using this apparatus, molecular beam epitaxial layers are grown on a GaAs substrate in the same manner as in Example 1. The GaAs substrate with an oxidized film is fixed to a molybdenum block by an indium solder, and introduced into the chamber 1 through the gate valve 26. After the chamber 1 is in vacuum, the GaAs substrate is carried into the chamber 2 through the gate valves 21 and 22, in which the GaAs substrate is heated for degasification. The GaAs substrate is then carried from the chamber 2 to the chamber 11 and introduced into the chamber 3 through the gate valve 23, in which the GaAs substrate is heated to 600° C. during a radiation treatment by the $As_4$ molecular beam from As cells and is allowed to stand for 10 minutes, after which the temperature of the GaAs substrate is lowered to 200° C. By his pre-treatment of the GaAs substrate in the chamber 3, the oxidized film on the surface of the GaAs substrate is completely removed. The GaAs substrate is then carried into the chamber 11, again, and introduced into the chamber 4 through the gate valve 24, in which the GaAs substrate is radiated with a molecular beam from each cell, resulting in epitaxial layers of GaAlInP.

EXAMPLE 3

In the above-mentioned examples, the pre-treatment chamber 3 provided with only the As cells was used, but it is not limited thereto. The pre-treatment chamber 3 can contain Ga cells in addition to the As cells, thereby achieving the growth of GaAs. Thus, after the removal of the oxidized film from the surface of the substrate, a GaAs buffer layer is grown on the substrate by radiation with the Ga molecular beam in the pre-treatment chamber 3, and then the substrate is carried into the growth chamber 4 in which crystal growth is carried out on the buffer layer of the substrate in the same manner as in the above-mentioned examples. This method is advantageous in that the growth of epitaxial layers which are more crystallizable than those grown on the bulk substrate can be attained.

EXAMPLE 4

In this example, the pre-treatment chamber 3 is provided with In cells. After the removal of the oxidized film from the surface of the GaAs substrate, a thin InAs layer is formed as a protective film on the substrate by radiation with the In molecular beam, and then the GaAs substrate is transported to the growth chamber 4, in which the temperature of the substrate is raised while the GaAs substrate is radiated with the P molecular beam in the same manner as in the above-mentioned examples. The InAs layer on the GaAs substrate is evaporated at about 45°–500° C., resulting in a GaAs substrate with a clean surface. By simultaneous radiation with molecular beams of, for example, In and Ga on the clean suface of the substrate, it is possible to begin the growth of InGaP on the GaAs substrate. The advantage of the formation of the InAs protective film on the surface of the GaAs substrate is as follows: Since there is a great lattice mismatch between the InAs layer and the GaAs substrate, a thin InAs layer in the case where the thin InAs layer has a thickness of 50–100 Å is grown in the form of three-dimensional islands having a corrugated surface on the GaAs substrate. When the substrate is heated monitoring the surface thereof by RHEED prior to the crystal growth thereon, the RHEED pattern can be observed as spots as long as the InAs remains. However, upon the complete removal of InAs from the GaAs substrate, the RHEED pattern is present as streaks which reflect the flatness of the surface of the GaAs substrate, so that the time of the beginning of crystal growth can be determined by the observation of the RHEED pattern.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A method for the production of semi-conductor devices comprising:
    subjecting a GaAs substrate with an oxidized film thereon to a degasification treatment in a heating chamber;
    heating the substrate during a radiation treatment by a molecular beam of As within a pre-treatment chamber to remove the oxidized film from the substrate;
    subjecting the substrate to irradiation with a molecular beam of In within said pre-treatment chamber after the removal of the oxidized film; and
    growing a phosphorous compound semiconductor layers on the substrate by molecular beam epitaxy within a growth chamber connected to the pre-treatment chamber.

2. A method for the production of semiconductor devices comprising:
    subjecting a GaAs substrate with an oxidized film thereon to a degasification treatment in a heating chamber;
    heating the substrate during a radiation treatment by a molecular beam of As within a pre-treatment chamber to remove the oxidized film from the substrate;
    subjecting the substrate to irradiation with a molecular beam of Ga within said pre-treatment chamber after the removal of the oxidized film; and
    growing a phosphorous compound semiconductor layer on the substrate by molecular beam epitaxy within a growth chamber connected to the pre-treatment chamber.

3. A method for the production of semiconductor devices comprising:
    subjecting a GaAs substrate with an oxidized film thereon to a degasification treatment in a heating chamber;
    heating the substrate during a radiation treatment by a molecular beam of As within a pre-treatment chamber to remove the oxidized film from the substrate;
    subjecting the substrate to irradiation with a further molecular beam of As within said pre-treatment chamber after the removal of the oxidized film; and
    growing a phosphorous compound semiconductor layer on the substrate by molecular beam epitaxy within a growth chamber connected to the pre-treatment chamber.

* * * * *